United States Patent [19]

Takada et al.

[11] Patent Number: 5,955,902
[45] Date of Patent: *Sep. 21, 1999

[54] FREQUENCY MULTIPLIER USING A VOLTAGE CONTROLLED DELAY CIRCUIT

[75] Inventors: Shuichi Takada, Kawasaki; Akihiko Yoshizawa, Yokohama, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/812,972

[22] Filed: Mar. 5, 1997

[30] Foreign Application Priority Data

Apr. 1, 1996 [JP] Japan ..................................... 8-078851

[51] Int. Cl.$^6$ .................................................. H03K 5/159
[52] U.S. Cl. ......................... 327/116; 327/114; 327/113; 327/261; 327/158; 327/149; 327/263
[58] Field of Search ..................................... 327/156, 158, 327/159, 147, 149, 150, 152, 153, 161, 263, 244, 276, 261

[56] References Cited

U.S. PATENT DOCUMENTS 5,463,337  10/1995  Leonovich .............................. 327/244

FOREIGN PATENT DOCUMENTS

| 0 441 684 | 8/1991 | European Pat. Off. . |
| 0 477 582 | 4/1992 | European Pat. Off. . |
| 0 570 158 | 11/1993 | European Pat. Off. . |
| 7-202649 | 8/1995 | Japan . |

*Primary Examiner*—Dinh T. Le
*Attorney, Agent, or Firm*—Oblon, Spivak, McClelland, Maier & Neustadt, P.C.

[57] ABSTRACT

A voltage controlled delay circuit is comprised of a plurality of stages of delay cells and produces a 2N number of signals delayed behind a reference signal in units of time corresponding to 1/2N the delay time between the reference signal supplied to an input terminal of a first stage delay cell and a signal output from a final stage delay cell. A phase coincidence is achieved between the reference signal and the output signal from the final stage delay cell by a loop including a phase comparator, lowpass filter and voltage controlled delay circuit. An N multiplying logic circuit produces an N multiplied signal from the reference signal with only falls or rises of 2N delay signals.

24 Claims, 4 Drawing Sheets

FREQUENCY MULTIPLIER USING A VOLTAGE CONTROLLED DELAY CIRCUIT

BACKGROUND OF THE INVENTION

The present invention relates to a frequency multiplier using a voltage-controlled delay circuit and, in particular, to a frequency multiplier for use in a microcomputer and DSP (digital signal processor).

FIG. 9 shows a conventional ordinary N-multiplying frequency multiplier. A reference signal Fref is supplied to an input terminal of a voltage-controlled delay circuit (VCD)1 and also to a first input terminal of a phase comparator (PHC) 3. An output signal Fdel of the voltage controll ed delay circuit 1 is supplied to an inverter 2. An output signal Fdeln of the inverter 2 is supplied to a second input terminal of the phase comparator 3. The phase comparator 3 detects a phase difference between the falls or rises of both signals Fref and Fdeln and an error signal Verr corresponding to the phase difference is supplied to an input terminal of a lowpass filter (LPF) 4. The lowpass filter 4 takes out only a DC component of the error signal Verr and supplies it as a control voltage Vcont to a voltage controlled delay circuit 1. If feedback control is effected to cancel the phase difference between the reference signal Fref and the delay signal Fdeln, then the output signal Fdel of the voltage controlled delay circuit 1 becomes a half-period delayed reference signal Fref.

The voltage controlled delay circuit 1 is comprised of a plurality of series-connected inverter circuits. The reference signal Fref is supplied to an input terminal of an initial stage inverter circuit and an output terminal of a final stage inverter circuit produces a delayed replica Fdel of the reference signal Fref. The voltage controlled delay circuit 1 has an n number of intermediate terminals. With k representing a natural number 1 to N, the k-th intermediate terminal produces a delay signal Fk obtained by delaying the reference signal Fref by (k−1)/N times the whole delay time of the delay signal Fdel to the reference signal Fref. That is, the delay signal F1 is the same as the reference signal Fref, the delay signal F2 is delayed behind the reference signal Fref by 1/N times the whole delay time, and the delay signal FN is delayed behind the reference signal Fref by (N−1)/N times the whole delay time.

The N-multiplying logic circuit 24 is comprised of an N/2 number of exclusive OR gates 5-1 to 5-N/2 and an adder 8. Delay signals F1 and F2 output from the voltage controlled delay circuit 1 are supplied to first and second input terminals of the exclusive OR gate 5-1. An output signal D1 of the exclusive OR gate 5-1 is supplied to a first input terminal of the adder 8. In this way, delay signals F(N−1) and FN output from the voltage controlled delay circuit 1 are supplied to first and second input terminals of the exclusive OR gate 5-N/2 and an output signal N/2 of the exclusive OR gate 5-N/2 is supplied to an N/2-th input terminal of the adder 8. The output signal of the adder 8 becomes an N-multipled signal Fout of the reference signal Fref.

The circuit above produces the N-multiplied signal with the use of both the rise and fall of the delay signal (F1 to FN).

Since, generally, the operation speed of an NMOS transistor constituting an inverter is faster than the operation speed of a PMOS transistor, the rise and fall times of the signal propagating over the inverters of the voltage controlled delay circuit 1 vary.

As a result, the signal propagating in the voltage controlled delay circuit 1 becomes sometimes shorter in the high period than in the low period. An N multiplying signal, being composed from a signal whose duty ratio is not 50%, produces frequency jitters.

Under these situation, in order to make the operation speed of the NMOS transistor and that of the PMOS transistor equal to each other, control has sometimes been made on the transistor sizes, such as the channel length or channel width, of the PMOS and NMOS transistors. It has been very difficult, however, to obtain exactly the same speed between both the type of transistors because there is a variation in the manufacturing condition and in the threshold voltage Vth of these transistors.

Further, it has not been possible for the conventional circuit to, upon receipt of a reference signal whose duty ratio is not 50%, compose a multiplied signal by itself.

As set out above, there has been restriction to the reference signal in the conventional technique. Further, the duty ratio of the multiplied signal does not become 50% and the multiplied signal involves frequency jitters. It has been difficult to obtain an accurate multiplied signal.

BRIEF SUMMARY OF THE INVENTION

It is accordingly the object of the present invention to provide a frequency multiplying circuit which, irrespective of a reference signal's duty ratio, can stably generate a multiplied signal of a 50% duty ratio.

The object of the present invention is achieved by the following circuit arrangement.

A frequency multiplying circuit comprises:

a voltage controlled delay circuit receiving a reference signal at an input terminal and generating a delay signal at an output terminal, the voltage controlled delay circuit having a control voltage input terminal and a 2N number of intermediate terminals for generating signals delayed behind the reference signal in units of time corresponding to 1/2N the whole delay time between the delay signal and the reference signal;

a phase comparator supplied, at a first input terminal, with the delay signal output from the voltage controlled delay circuit and, at a second terminal, with the reference signal to produce an error signal corresponding to a phase difference between the delay signal and the reference signal;

a lowpass filter supplied, at an input terminal, with the error signal output from the phase comparator and having an output terminal connected to a control voltage input terminal of the voltage controlled delay circuit; and An N multiplying logic circuit having a 2N number of input terminals connected to the corresponding intermediate terminals of the voltage controlled delay circuit to produce an N multiplied signal from the reference signal with only rises or falls of input signals thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
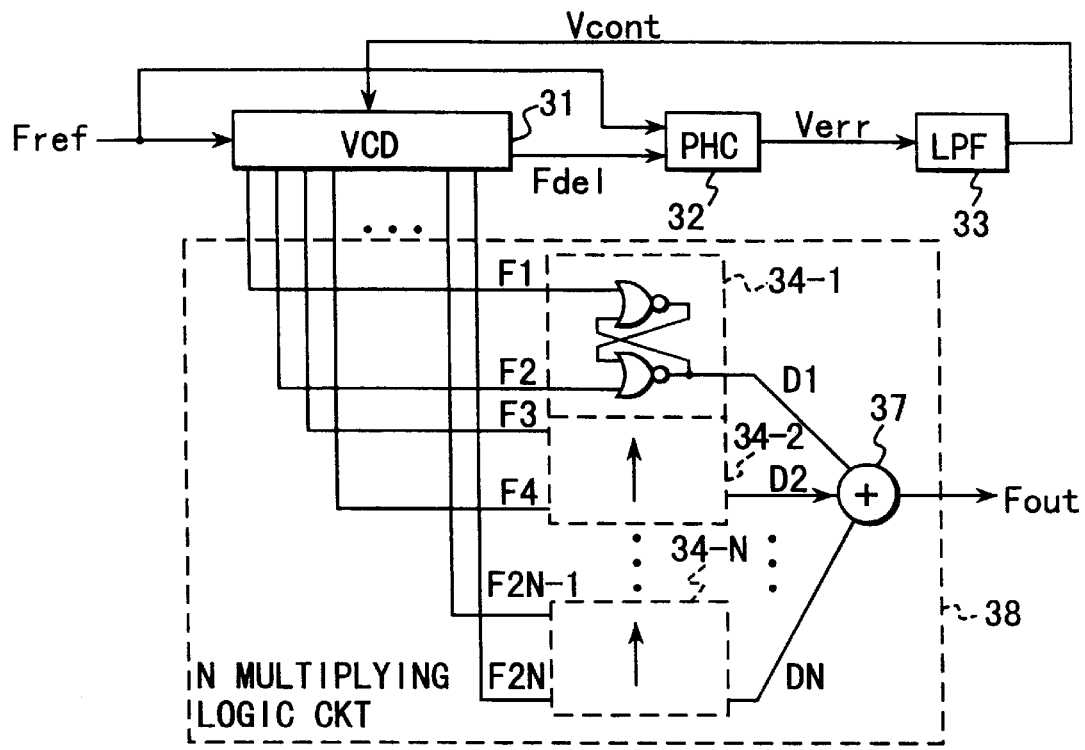
FIG. 1 is a circuit diagram showing a first embodiment of the present invention.

FIG. 1 shows a first embodiment of the present invention. The same reference numerals are employed to designate the same parts or elements throughout the specification and any further explanation is omitted.

A reference signal Fref is supplied to the input terminal of a voltage controlled delay circuit 31. The voltage controlled delay circuit 31 is adapted to control a delay amount of a signal in the circuit in accordance with a control voltage supplied to its control voltage input terminal. The voltage controlled delay circuit 31 outputs a delay signal Fdel, that is, a signal obtained by delaying the reference signal Fref in accordance with a control voltage.

The reference signal Fref is supplied to a first input terminal of a phase comparator 32 and the delay signal Fdel is supplied to a second input terminal. The phase comparator 32 detects a phase difference between the rises, or falls, of the input signal and outputs an error signal Verr corresponding to a phase difference.

The error signal Verr is supplied to an input terminal of a lowpass filter 33. The lowpass filter 33 takes only a DC component out of the error signal Verr and supplies it as a control voltage Vcont to a control voltage input terminal of the voltage controlled delay circuit 31.

Further, the voltage controlled delay circuit 31 has a 2N number of intermediate terminals. With k representing a natural number 1 to 2N, the Kth intermediate terminal outputs a delay signal Fk, that is, a signal obtained by delaying the reference signal Fref by (K−1)/2N times the whole delay time to the reference signal Fref of the delay signal Fdel. That is, a delay signal F1 is the same as the reference signal Fref, a delay signal F2 is delayed behind the reference signal Fref by 1/2N the whole delay time, and a delay signal F2N is delayed behind the reference signal Fref by (2N−1)/2N times the whole delay time.

A 2N number of delay signals F1 to F2N are supplied to input terminals of an N-multiplying logic circuit 38. The N-multiplying logic circuit 38 generates an N-multiplied signal Fout.

The N-multiplying logic circuit 38 comprises an N number of "rise" detection circuits 34-1 to 34-N and an adder 37.

The delay signal F1 is supplied to a first input terminal of the "rise" detection circuit 34-1 and the delay signal F2 to a second input terminal. The respective "rise" detection circuit is comprised of a flip-flop circuit of, for example, two NOR gates. In the "rise" detection circuit 34-1, for example, the delay signal F1 is supplied to a set terminal of an RS flip-flop and the delay signal F2 to a reset terminal of the RS flip-flop and a Q output terminal of the RS flip-flop produces an output signal D1. In this way, delay signals F3 and F4 are supplied to the first and second input terminals of a "rise" detection circuit 34-2 and an output signal D2 is produced from the detection circuit 34-2 and delay signals F2N−1 and F2N are supplied to first and second input terminals of a "rise" detection circuit 34-N and an output signal DN is produced. These output signals D1 to DN are supplied to an N number of input terminal of an adder 37. The adder 37 produces an N-multiplied signal Fout of the reference signal Fref.

The "rise" detection circuits 34-1 to 34-N in the N-multiplying logic circuit 38 produce a multiplied signal with the use of only the rising edges of the signal propagating in the voltage controlled delay circuit 31.

Figure 2:
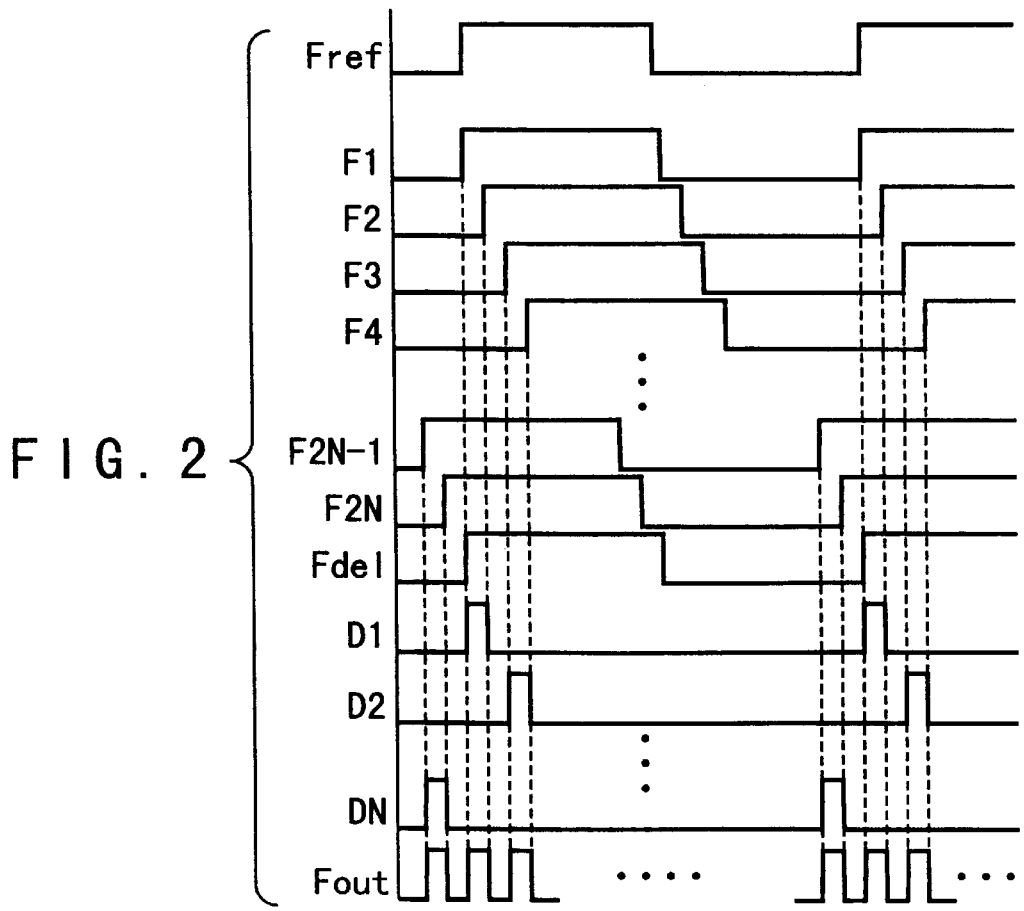
FIG. 2 is a timing chart relating to the first embodiment of the present invention.

FIG. 2 shows a timing chart of the reference signal Fref, delay signal Fdel, delay signals F1 to F2N, "rise" detection circuit's output signals D1 to DN and N multiplied signal Fout. With the cycle of the reference signal Fref represented by T, the phase difference between the adjacent delay signals is given by T/2N. A pulse-like output signal D1 is generated from the rising edges of the delay signals F1 and F2 as shown in FIG. 2. In this way, the signals D1 to DN are output from the rise detection circuits D1 to DN with the use of delay signals F1 to F2N. The N multiplied signal Fout of the reference signal Fref is generated by adding the output signals D1 to DN of the "rise" detection circuits.

According to the present invention, the multiplying signals are created with the use of only the rising edges of the delay signals of the voltage controlled delay circuit and, irrespective of the duty ratio of the reference signal, a process variation, power supply voltage, temperature and so on, it is possible to obtain a multiplied signal of a 50% duty ratio and hence to obtain a multiplied signal of less frequency jitters.

In the present embodiment, the whole delay time between the reference signal Fref and the delay signal Fdel of the voltage controlled delay circuit 31 is equal to one cycle of the reference signal Fref. As shown in FIG. 2, therefore, the signals F1 and F(N+1), signals F2 and F(N+2), . . . , signals FN and F2N, propagating in the voltage controlled delay circuit 31 provide mutually inverted signals. By inverting the delay signals F1 to FN output from the voltage controlled delay circuit it is possible to obtain the same signals as delay signals F(N+1) to F2N.

Figure 3:
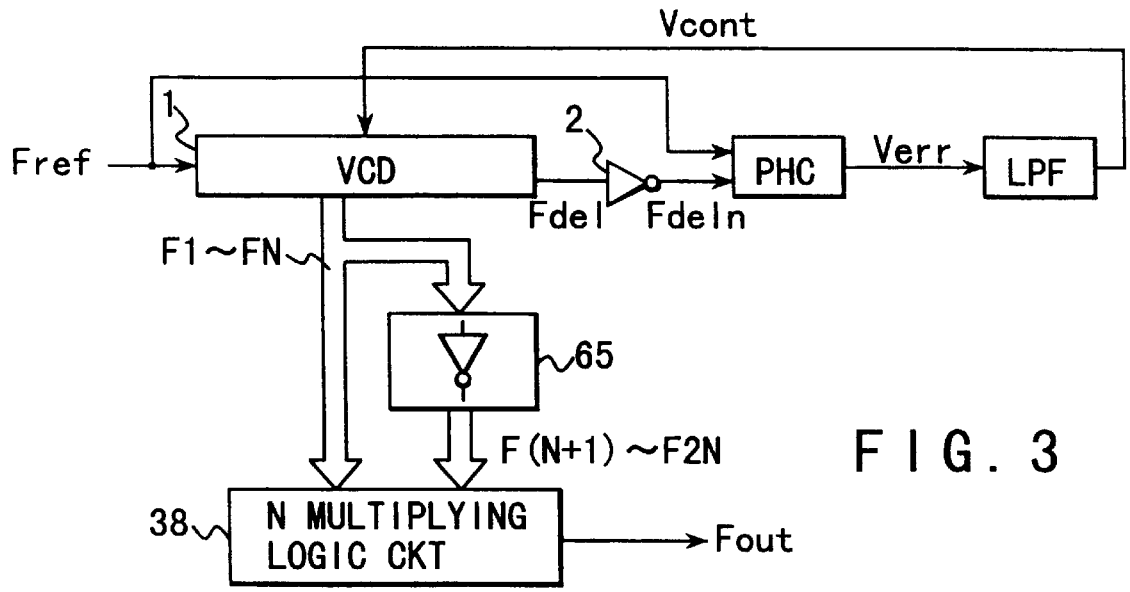
FIG. 3 is a block diagram showing a second embodiment of the present invention.

FIG. 3 shows a second embodiment of the present invention with the use of this method.

A circuit shown in FIG. 3 comprises the same circuit as shown in FIG. 3, that is, a voltage controlled delay circuit 1, inverter 2, phase comparator 3 and lowpass filter 4 as well as an inverting circuit 65 and N multiplying logic circuit 38.

Figure 9:
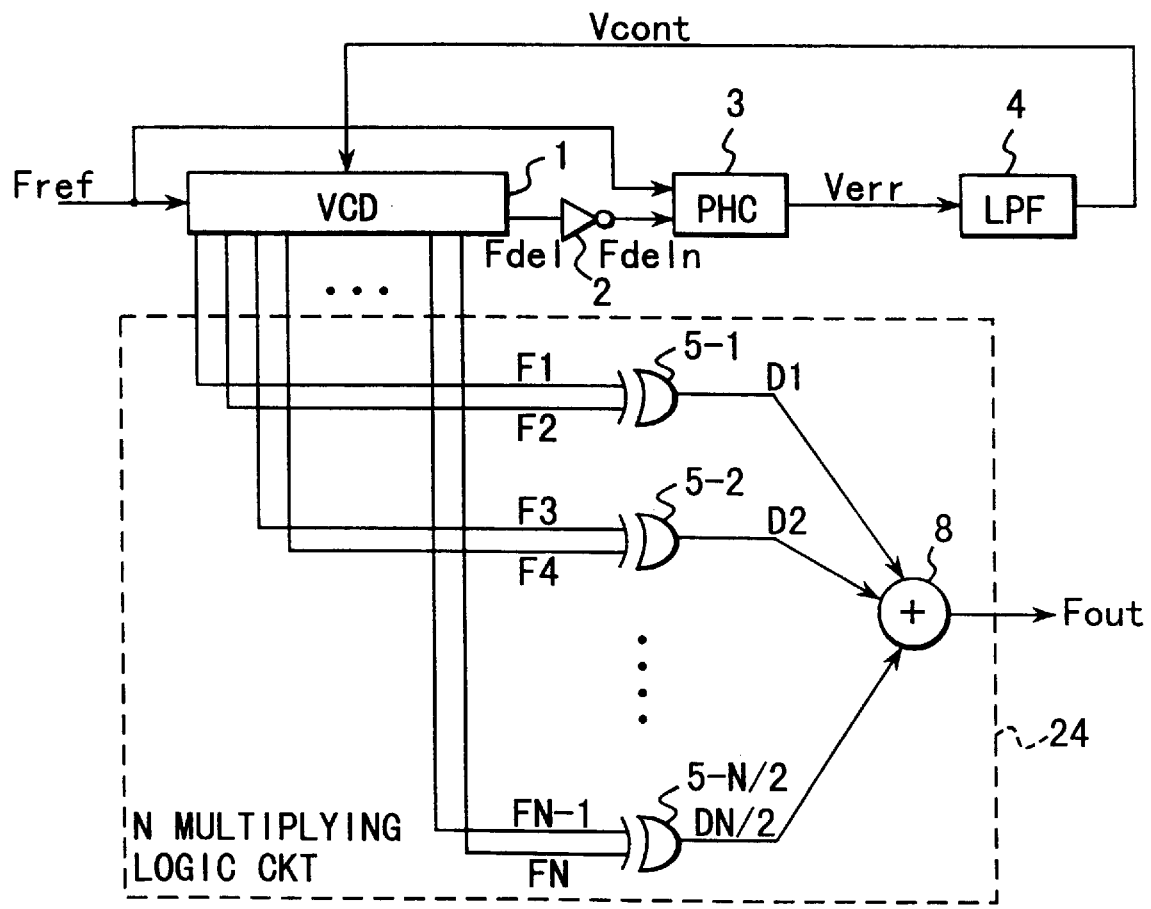
FIG. 9 is a view showing a conventional frequency multiplying circuit.

As in the case of the conventional circuit as shown in FIG. 9, the voltage controlled delay circuit 1 generate delay signals F1 to FN delayed behind the reference signal Fref by in 1/N units of the delay time between the reference signal Fref and the delay signal Fdel.

Delay signals F1 to FN are supplied to the input terminals of the inverting circuit 65. The inverting circuit 65 creates inverted replicas F(N+1) to F2N of the delay signals F1 to FN.

The N multiplying logic circuit 38 is of such a type as shown in FIG. 1. The delay signals F1 to FN and inverted signals F(N+1) to F2N are supplied to a 2N number of input terminals of the N multiplying logic circuit 38. The N multiplying logic circuit 38 generates an N multiplied signal Fout with the use of the rises of these signals F1 to F2N.

According to the present embodiment it is possible to obtain the same advantage as in the first embodiment and to render the number of intermediate output taps of the voltage controlled delay circuit and of inverter circuit one half those of the first embodiment.

Figure 4:
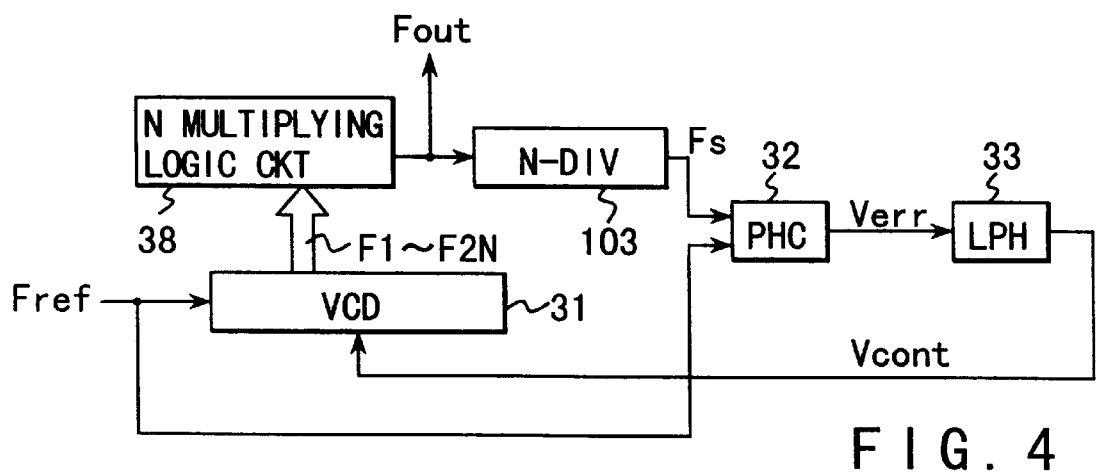
FIG. 4 is a block diagram showing a third embodiment of the present invention.

FIG. 4 shows a third embodiment of the present embodiment.

The circuit shown in FIG. 4 comprises a voltage controlled delay circuit 31, N multiplying logic circuit 38, divide-by-N frequency divider (N-DIV) 103, phase comparator 32 and lowpass filter 33.

The voltage controlled delay circuit 31 is supplied, at its input terminal, with a reference signal Fref and generates delayed replicas (signals) F1 to F2N of the reference signal Rref as in the same way as shown in FIG. 1.

The N multiplying logic circuit 38 is the same as that shown in FIG. 1. The delay signals F1 to F2N are supplied to the input terminals of the N multiplying logic circuit 38. The N multiplying logic circuit 38 outputs an N multiplied signal Fout.

The divide-by-N frequency divider 103 is supplied, at its input terminal, with the N multiplied signal Fout and generates an N divided signal Fs.

The phase comparator 3 receives the output signal Fs of the divide-by-N circuit 103 at its first input terminal and the reference signal Fref at its second input terminal. The phase comparator 3 generates an error signal Verr.

The error signal Verr is supplied to the input terminal of the lowpass filter 4 and the output terminal of the lowpass filter 4 is connected to a control voltage input terminal of the voltage controlled delay circuit 31.

The third embodiment can obtain the same advantage as in the first embodiment. In the first and second embodiments as set out above, a delay occurs in the N multiplying logic circuit and there occurs a corresponding phase difference between the reference signal Fref and the N multiplied signal Fout. Although, in the third embodiment, the N multiplying logic circuit 38 is inserted in a phase-locked loop, it is possible to obtain an N-multipled signal Fout having no phase difference relative to the reference signal Fref.

Figure 5:
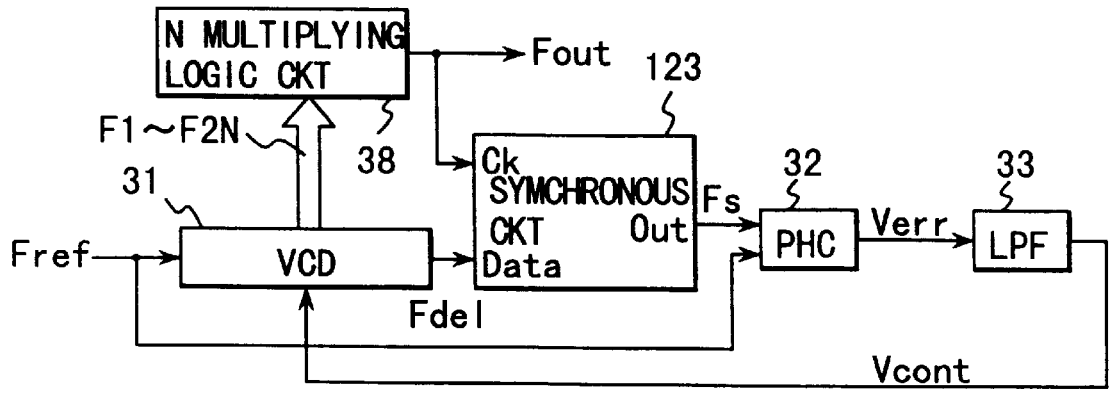
FIG. 5 is a block diagram showing a fourth embodiment of the present invention.

FIG. 5 shows a fourth embodiment of the present invention.

The circuit of this embodiment comprises a voltage controlled delay circuit 31, N multiplying logic circuit 38, synchronous circuit 123, phase comparator 32 and lowpass filter 33.

The voltage controlled delay circuit 31 is the same as that shown in FIG. 1. A reference signal Fref is supplied to the input terminal of the voltage controlled delay circuit 31. The voltage controlled delay circuit 31 generates delay signals F1 to F2N and delay signal Fdel.

The N multiplying logic circuit 38 is the same as that shown in FIG. 1. The N multiplying logic circuit 38 receives the delay signals F1 to F2N at its input terminal and generates an N multiplied signal Fout at its output terminal.

The synchronous circuit 123 is comprised of, for example, a latch circuit. The synchronous circuit 123 receives an output signal Fdel of the voltage controlled delay circuit 31 at its data input terminal Data and the N multiplied signal Fout at its clock input terminal Ck. An output terminal Out of the synchronous circuit 123 generates a signal Fs.

The output signal Fs of the synchronous circuit 123 is supplied to a first input terminal of the phase comparator 32 and the reference signal Fref to a second input terminal of the phase comparator 32. The phase comparator 32 produces an error signal Verr.

The error signal Verr is supplied to the input terminal of the lowpass filter 33 and the output terminal of the lowpass filter 33 is connected to a control voltage input terminal of the voltage controlled delay circuit 31.

According to this embodiment it is possible to obtain the same advantage as in the embodiment shown in FIG. 1. Since, in the fourth embodiment, the N multiplying logic circuit 38 is inserted in the phase-locked loop as in the embodiment shown in FIG. 4, it is possible to obtain the N multiplied signal Fout.

Figure 6:
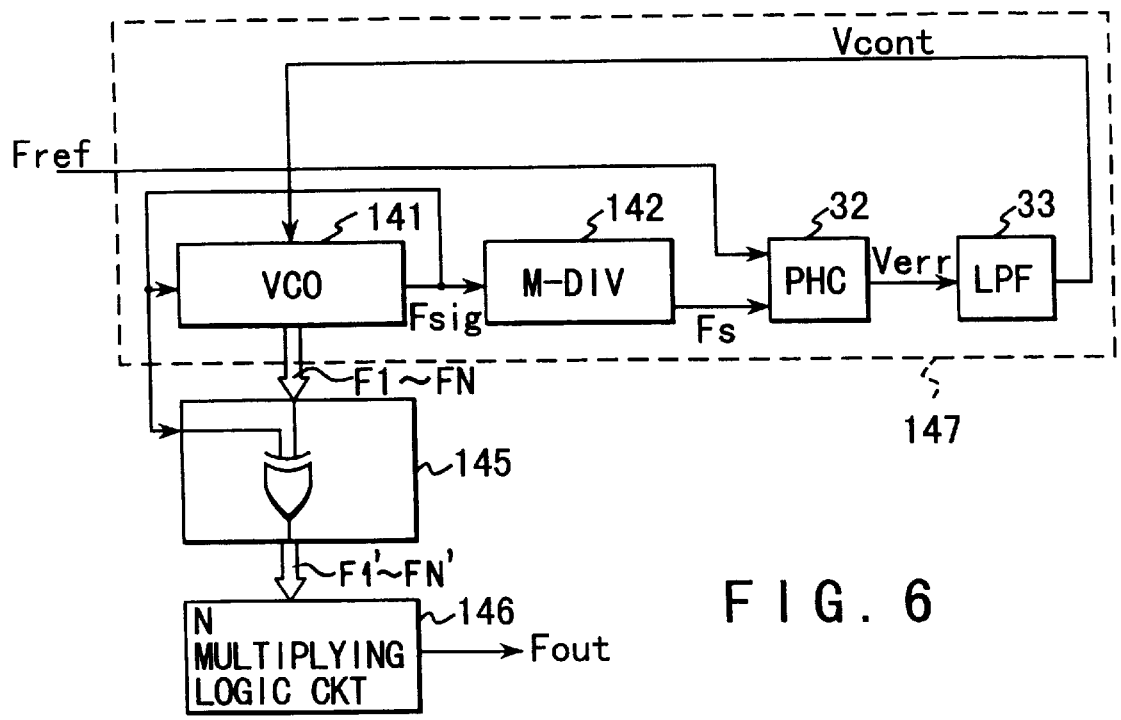
FIG. 6 is a block diagram showing a fifth embodiment of the present invention.

FIG. 6 shows a fifth embodiment of the present invention.

The circuit of FIG. 6 comprises a PLL circuit 147, exclusive OR circuit 145 and N multiplying logic circuit 38. The PLL circuit 147 comprises a voltage controlled oscillator (VCO)141, divide-by-M frequency divider 142, phase comparator 32 and lowpass filter 33.

The voltage controlled oscillator 141 is comprised of a ring oscillator constituted by a plurality of series-connected delay cells. An output signal Fsig of a final-stage delay cell is connected to an input terminal of a first stage delay cell. The amount of delay in the respective delay cell is controlled by a voltage supplied to the control voltage input terminal of the voltage controlled oscillator.

The output signal Fsig of the voltage controlled oscillator 141 is supplied to the input terminal of the frequency divider 142. The divide-by-M frequency divider 142 generates a corresponding divided signal Fs.

The reference signal Fref is supplied to a first input terminal of the phase comparator 32 and the output signal Fs of the frequency divider 142 is supplied to a second input terminal of the phase comparator 32. The phase comparator 32 compares the reference signal Fref with the signal Fs to produce an error signal Verr.

The error signal Verr is supplied to the input terminal of the lowpass filter 33. The output terminal of the lowpass filter 33 is connected to the control voltage input terminal of the voltage controlled delay circuit 141. For this reason, the frequency of the output signal Fsig of the voltage controlled oscillator becomes M times the frequency of the reference signal Fref.

The voltage controlled oscillator 141 generates delay signals Fl to FN delayed behind the output signal Fsig in units of a delay amount of 1/2N the oscillation cycle of the output signal Fsig. With k representing a natural number from 1 to N, the delay signal Fk is delayed behind the signal Fsig by a time of $(k-1)/2N$ times the cycle of the signal Fsig.

The exclusive OR circuit 145 is comprised of an N number of exclusive OR gates. The delay signals F1 to FN are supplied to the corresponding first input terminals of an N number of exclusive OR gates. Further, the output signal Fsig of the voltage controlled oscillator 141 is supplied to the second input terminals of the N number of exclusive OR gates. The output terminals of the N number of the exclusive OR gates produce the corresponding signals F1' to FN'.

The N multiplying logic circuit 146 comprises a N/2 number of "rise" detection circuits, as in the case of the "rise" detection circuits in the N multiplying logic circuit 38, and an addition circuit for adding together the output signals of these "rise" detection circuits. The signals F1' to FN' are supplied to the N number of input terminals of the N multiplying logic circuit 146. For example, the signal F1' is supplied to the first input terminal of the first "rise" detection circuit and the signal F2' to the second input terminal. The signal F3' is supplied to the first input terminal of the second "rise" detection circuit and the signal F4' is supplied to the second input terminal. Further, a signal Fout is output from the addition circuit, noting that it has a frequency of M×N times that of the reference signal Fref.

According to this embodiment, if a multiplying signal with a multiplying number as large as, for example, several hundreds of times is obtained, it is possible to lower the multiplying number in the PLL circuit 147 and to lower the frequency jitters. Further, by increasing the multiplying number of the multiplying logic circuit it is possible to increase a multiplying number without varying the oscillation frequency of the voltage controlled oscillator and the frequency division ratio of the divider.

Figure 7:
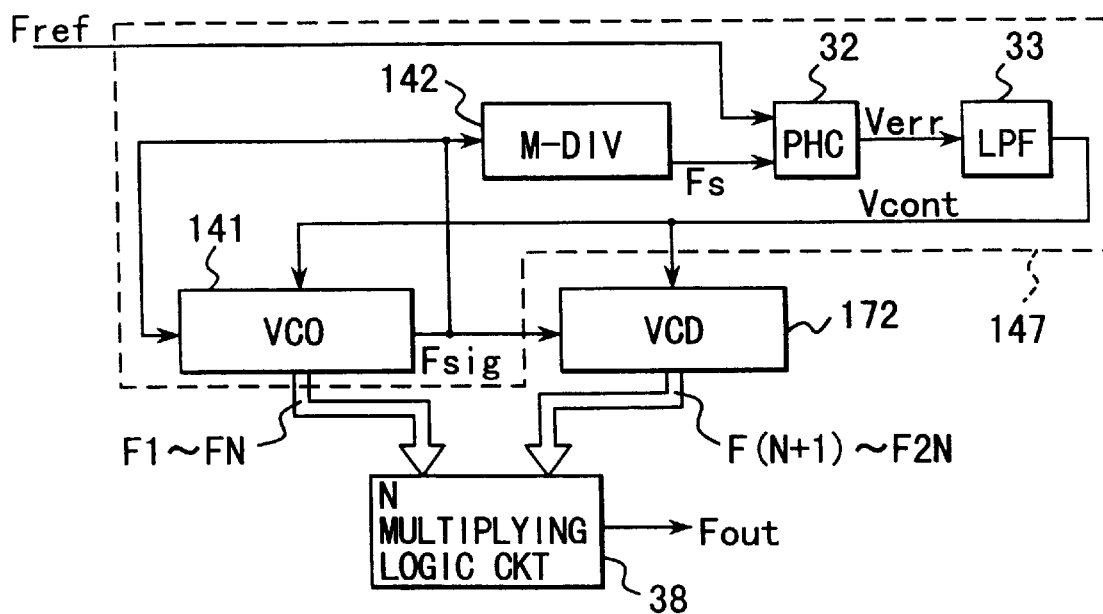
FIG. 7 is a block diagram showing a sixth embodiment of the present invention.

FIG. 7 shows a sixth embodiment of the present embodiment.

The circuit of FIG. 7 comprises a PLL circuit 147, voltage controlled delay circuit 172 and N multiplying logic circuit 38. Like the PLL circuit as shown in FIG. 6, the PLL circuit 147 comprises a voltage controlled oscillator 141, divide-by-M frequency divider (M-DIV) 142, phase comparator 32 and lowpass filter 33.

Further, the voltage controlled oscillator 141 is comprised of an N stage of delay cells. The output signal Fsig of the N-th delay cell is supplied to the input terminal of the 1st delay cell. The voltage controlled oscillator 141 produces delay signals Fl to FN delayed behind the signal Fsig in units of a delay amount of 1/2N the oscillation cycle of the output signal Fsig.

The voltage controlled delay circuit 172 is comprised of an N stage of delay cells the same as those in the voltage controlled oscillator 141. The output signal Fsig of the voltage controlled oscillator 141 is supplied to the input terminal of the 1st delay cell and the output signal of the lowpass filter 33 is supplied to the control voltage input terminal. The voltage controlled delay circuit 172 produces signals F(N+1) to F2N delayed behind the output signal Fsig in units of a delay amount of 1/2N the oscillation cycle of the output signal Fsig.

The N number of delay signals F1 to FN of the voltage controlled oscillator 141 and N number of delay signals F(N+1) to F2N are supplied to a 2N number of input terminals of the N multiplying logic circuit 38. The output signal Fout of the N multiplying logic circuit 38 has a frequency of M×N times that of a reference signal Fref.

According to the present invention it is possible to obtain the same advantage as that of FIG. 6. That is, since the multiplying number can be lowered in the PLL circuit 147, it is possible to lower the frequency jitters.

Figure 8:
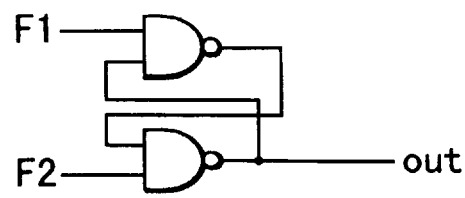
FIG. 8 is a view showing a fall detection circuit of the present invention.

Although, in the embodiment as set out above, the N multiplying logic circuit has been explained as using the "rise" detection circuits including the flip-flop composed of two NOR gates as well as the adding circuit, the present invention is not restricted thereto. The N multiplying logic circuit can comprise "fall" detection circuits using a flip-flop comprised of, as shown in FIG. 8, two NAND gates for instance and an AND circuit to the input terminals of which the output terminals of the "fall" detection circuits are connected. The "rise" detection circuit or "fall" detection circuit is naturally not restricted only to the flip-flop.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and 2N intermediate terminals for outputting respective intermediate signals delayed by, respectively, 1/2N, 2/2N, 3/2N, . . . , 2N/2N times a delay which the delay signal has with respect to the reference signal;

a phase comparator supplied, at a first input terminal, with the delay signal output from the voltage controlled delay circuit and, at a second terminal, with the reference signal to produce an error signal corresponding to a phase difference between the delay signal and the reference signal;

a low pass filter supplied, at an input terminal, with the error signal from the phase comparator and having an output terminal connected to the control voltage input terminal of the voltage controlled delay circuit;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulses are both always triggered only by leading edges of said intermediate signals; and an adder coupled to said N intermediate output terminals and configured to combine said N respective output pulses to produce an N multiplied signal.

2. A frequency multiplying circuit according to claim 1, wherein the N multiplying logic circuit comprises:

an N number of flip flop circuits having input terminals connected to the input terminals of N multiplying logic circuit.

3. A frequency multiplying circuit for multiplying a frequency of a reference signal by N, N being an integer greater than one, compising:

a voltage controlled delay circuit for receiving the reference signal at an input terminal and generating a delay signal at at output terminal, said voltage controlled delay circuit having a control voltage input terminal, and N intermediate terminals for outputting respective intermediate signals delayed by, respectively, 1/N, 2/N, 3/N, . . . N/N times a delay which the delay signal has with respect to the reference signal;

a phase comparator supplied, at a first input terminal, with an inverted replica of the delay signal output from the voltage controlled delay circuit and, at a second input terminal, with the reference signal to produce an error signal corresponding to a phase difference between the delay signal and the reference signal;

a low pass filter supplied, at an input terminal, with the error signal from the phase comparator and having an output terminal connected to the control voltage input terminal of the voltage controlled delay circuit;

an N multiplying logic circuit having 2N input terminals, N input terminals being connected to the N intermediate terminals respectively and the remaining N input terminals being supplied with inverted replicas of signal outputs from the N intermediate terminals, for logically combining consecutive pairs of said intermediate signals and said inverted replicas of said intermediate signals to produce N respective output pulses for each period of said reference signal at N intermediate output terminals, wherein rising and falling edges of each of the N respective output pulses are both always triggered only by leading edges of said intermediate signals and by leading edges of said inverted replicas of said intermediate signals; and an adder coupled to said N intermediate out terminals and configured to combine said N respective output pulses to produce an N multiplied signal.

4. A frequency multiplying circuit according to claim 3, wherein the N multiplying logic circuit comprises:

an N number of flip flop circuits having input terminals connected to the input terminals of N multiplying logic circuit.

5. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and 2N intermediate terminals for outputting respective intermediate signals delayed by, respectively, 1/2N, 2/2N, 3/2N, . . . 2N/2N times a delay which the delay signal has with respect to the reference signal;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulsed are both always triggered only by leading edges of said intermediate signals and by leading edges of said inverted replicas of said intermediate signals, an adder coupled to said N intermediate output terminals and configured to combine said N respective output puslses to produce an N multiplied output signal;

a divide-by-N frequency divider supplied, at an input terminal, with the N multiplied output signal from the N multiplying logic circuit and producing an N divided output signal;

phase comparator supplied, at a first input terminal, with the N divided output signal from the divide-by-N frequency divider and, at a second input terminal, with the reference signal to produce an error signal corresponding to a phase difference between both the signals; and a low pass filter supplied, at an input terminal, with the error signal from the phase comparator and having an output terminal connected to the control voltage input terminal of the voltage controlled delay circuit.

6. A frequency multiplying circuit according to claim 5, wherein the N multiplying logic circuit comprises:

an N number of flip flop circuits having input terminals connected to the input terminals of N multiplying logic circuit.

7. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and 2N intermediate terminals for outputting signals delayed by, respectively, 1/2N, 2/2N, 3/2N, . . . 2N/2N times a delay which the delay signal has with respect to the reference signal;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulses are both always triggered only by leading edges of said intermediate signals;

an adder coupled to said N intermediate output terminals and continued to combine said N respective output pulses to produce an N multiplied output signal;

a synchronous circuit supplied, at a data input terminal, with the delay signal from the voltage controlled delay circuit and, at a clock input terminal, with the N multiplied output signal from the N multiplying logic circuit to produce a delay signal corresponding to the output signal;

a phase comparator connected at a first input terminal to an output terminal of the synchronous circuit and supplied, at a second input terminal, with the reference signal to produce an error signal corresponding to a phase difference between both the signals; and a low pass filter supplied, at an input terminal, with the error signal from the phase comparator and having an output terminal connected to the control voltage input terminal of the voltage controlled delay circuit.

8. A frequency multiplying circuit according to claim 7, wherein the N multiplying logic circuit comprises:

an N number of flip flop circuits having input terminals connected to the input terminals of N multiplying logic circuit.

9. A frequency multiplying circuit for multiplying a frequency of an oscillation signal by N, N being an integer greater than one, comprising:

a voltage controlled oscillator having an input terminal connected to an output terminal thereof and supplying the oscillation signal at the output terminal, said voltage controlled oscillator having N intermediate terminals for outputting respective intermediate signals delayed by, respectively, 1/2N, 2/2N, 3/2N, . . . N/2N times a period of the oscillation signal;

a frequency divider connected at an input terminal to the output terminal of the voltage controlled oscillator to generate a frequency divided signal from the oscillation signal;

a phase comparator supplied at a first input terminal with the frequency divided signal from the frequency divider and at a second input terminal with a reference signal to generate an error signal corresponding to a phase difference between both the signals;

a lowpass filter supplied at an input terminal with the error signal from the phase comparator and connected at an output terminal to a control voltage input terminal of the voltage controlled oscillator;

N exclusive OR circuits each connected at a first input terminal with an output terminal of the voltage controlled oscillator and at a second input terminal to the N intermediate terminals of the voltage con d oscillator, respectively and producing N intermediate signals at respective output terminal of said N exclusive OR circuits; and an N multiplying logic circuit having N input terminals connected to the output terminals of the N exclusive OR circuits, respectively, for logically combining consecutive pairs of said intermediate signals to produce N respective output pulses for each period of said reference signal at N intermediate output terminals, wherein rising and falling edges of each of the N respective output pulses are both always triggered only by leading edges of said intermediate signals; and an adder coupled to said N intermediate output terminals and configured to combine said N respective output pulses to produce N multiplied output signal.

10. A frequency multiplying circuit according to claim 9, wherein the N multiplying logic circuit comprises:

an N number of flip flop circuits having input terminals connected to the input terminals of N multiplying logic circuit.

11. A frequency multiplying circuit for multiplying a frequency of an oscillation signal by N, N being am integer greater than one, compising:

a voltage controlled oscillator having an input terminal connected to an output terminal thereof and supplying the oscillation signal at the output terminal, said voltage controlled oscillator having N intermediate terminals for outputting signals delayed by, respectively, 1/2N, 2/2N, 3/2N, . . . N/2N times a period of the oscillation signal;

a voltage controlled delay circuit connected at an input terminal to the output terminal of the voltage controlled oscillator and having N intermediate terminals for outputting signals delayed by, respectively, N+1/2N, N+2/2N, N+3/2N, . . . 2N/2N times a period of the oscillation signal;

a frequency divider connected at an input terminal to the output terminal of the voltage controlled oscillator to produce a frequency divided signal from the oscillation signal;

a phase comparator supplied, at a first input terminal, with the frequency divided signal from the frequency divider and, at a second input terminal, with a reference signal to produce an error signal corresponding to a phase difference between both the signals;

a low pass filter supplied, at an input terminal, with the error signal and connected at an output terminal to a control voltage input terminal of the voltage controlled oscillator and to a control voltage input terminal of the voltage controlled delay circuit;

an N multiplying logic circuit having 2N input terminals, N input terminals of which are connected to the N intermediate terminals of the voltage controlled oscillator and the remaining N input terminals of which are connected to the N intermediate terminals of the voltage controlled delay circuit, respectively, for logically combining consecutive pairs of said intermediate signals to produce N respective output pulses for each period of said reference signal at N intermediate output terminals, wherein rising and falling edges of each of the N respective output pulses are both always triggered only by leading edges of said intermediate signals; and an adder coupled to said N intermediate output terminals and configured to combine said N respective output pulses to produce an N multiplied output signal.

12. A frequency multiplying circuit according to claim 11, wherein the N multiplying logic circuit comprises:

an N number of flip flop circuits having input terminals connected to the input terminals of N multiplying logic circuit.

13. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, ad 2N intermediate terminals for outputting respective intermediate signals delayed by, respectively, 1/2N, 2/2N, 3/2N, . . . 2N/2N times a delay which the delay signal has with respect to the reference signal;

a phase comparator supplied, at a first input terminal, with the delay signal output from the voltage controlled delay circuit and, at a second terminal, with the reference signal to produce an error signal corresponding to a phase difference between the delay signal and the reference signal;

a low pass filter supplied, at an input terminal, with the error signal from the phase comparator and having an output terminal connected to the control voltage input terminal of the voltage controlled delay circuit;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulses are both always triggered only by trailing edges of said intermediate signals; and an adder coupled to said N intermediate output terminals and configured to combine said N respective output pulses to produce an N multiplied output signal.

14. A frequency multiplying circuit according to claim 13, wherein the N multiplying logic circuit comprises:

an N number of flip-flop circuits having input terminals connected to the input terminals of the N multiplying logical circuit.

15. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and N intermediate terminals for outputting respective intermediate signals delayed by, respectively, 1/N, 2/N, 3/N, . . . N/N times a delay which the delay signal has with respect to the reference signal;

a phase comparator supplied, at a first input terminal, with an inverted replica of the delay signal output from the voltage controlled delay circuit and, at a second input terminal, with the reference signal to produce an error signal corresponding to a phase difference between the delay signal and the reference signal;

a low pass filter supplied, at an input terminal, with the error signal from the phase comparator and having an output terminal connected to the control voltage input terminal of the voltage controlled delay circuit;

an N multiplying logic circuit having 2N input terminals, N input terminals being connected to the N intermediate terminals respectively and the remaining N input terminals being supplied with inverted replicas of signal outputs from the N intermediate terminals, for logically combining consecutive pairs of said intermediate signals and said inverted replicas of said intermediate signals to produce N respective output pulses for each period of said reference signal at N intermediate output terminals, wherein rising and failing edges of each of the N respective output pulses are both always triggered only by trailing edges of said intermediate signals and by trailing edges of said inverted replicas of said intermediate signals; and an adder coupled to said N intermediate output terminals and configured to combine said N respective output pulses to produce an N multiplied output signal.

16. The frequency multiplying circuit according to claim 15, wherein the N multiplying logic circuit comprises an N number of flip-flop circuits having input terminals connected to the input terminals of the N multiplying logic circuit.

17. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and 2N intermediate terminals for outputting respective intermediate signals delayed by, respectively, 1/2N, 2/2N, 3/2N, . . . 2N/2N times a delay which the delay signal has with respect to the reference signal;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulses are both always triggered only by trailing edges of said intermediate signals and by trailing edges of said inverted replicas of said intermediate signals;

an adder coupled to said N intermediate output terminals and configured to combine said N respective output pulses to produce an N multiplied output signal;

a divide-by-N frequency divider supplied, at an input terminal, with the N multiplied output signal from the N multiplying logic circuit and producing an N divided output signal;

a phase comparator supplied, at a first input terminal, with the N divided output signal from the divide-by-N frequency divider and, at a second input terminal, with the reference signal to produce an error signal corresponding to a phase difference between both the signals; and a low pass filter supplied, at an input terminal, with the error signal from the phase comparator and having an output terminal connected to the control voltage input terminal of the voltage controlled delay circuit.

18. A frequency multi lying circuit according to claim 17, wherein the N multiplying logic circuit comprises an N number of flip-flop circuits connected at input terminals to input terminals of the N multiplying logic circuit.

19. A frequency multiplying circuit for multiplying a frequency of a reference signal by N, N being an integer greater than one, comprising:

a voltage controlled delay circuit for receiving the reference signal at an input terminal and generating a delay signal at an output terminal, said voltage controlled delay circuit having a control voltage input terminal, and 2N intermediate terminals for outputting signals delayed by, respectively, 1/2N, 2/2N, 3/2N, . . . 2N/2N times a delay which the delay signal has with respect to th reference signal;

an N multiplying logic circuit having 2N input terminals connected to the intermediate terminals, respectively, for logically combining consecutive pairs of said intermediate signals to produce N respective output pulses for each period of said reference signal at N intermediate output terminals, wherein rising and falling edges of each of the N respective output pulses are both always triggered only by trailing edges of said intermediate signals;

an adder coupled to said N intermediate output terminals and configured to combine said N respective output pulses to produce an N multiplied output signal;

a synchronous circuit supplied, at a data input terminal, with the delay signal from the voltage controlled delay circuit and, at a clock input terminal, with the N multiplied output signal from the N multiplying logic circuit to produce a delay signal corresponding to the output signal;

a phase comparator connected at a first input terminal to an output terminal of the synchronous circuit and supplied, at a second input terminal, with the reference signal to produce an error signal corresponding to a phase difference between both the signals; and a low pass filter supplied, at an input terminal, with the error signal from the phase comparator and having an output terminal connected to the control voltage input terminal of the voltage controlled delay circuit.

20. A frequency multiplying circuit according to claim 19, wherein the N multiplying logic circuit comprises an N number of flip-flop circuits connected at input terminals to the input terminals of the N multiplying logic circuit.

21. A frequency multiplying circuit for multiplying a frequency of an oscillation signal by N, N being an integer greater than one, comprising:

a voltage controlled oscillator having an input terminal connected to an output terminal thereof and supplying the oscillation signal at the output terminal, said voltage controlled oscillator having N intermediate terminals for outputting respective intermediate signals delayed by, respectively, 1/2N, 2/2N, 3/2N, . . . N/2N times a period of the oscillation signal;

a frequency divider connected at input terminal to the output terminal of the voltage controlled oscillator to generate a frequency divided signal from the oscillation signal;

a phase comparator supplied at a first input terminal with the frequency divided signal from the frequency divider and at a second input terminal with a reference signal to generate an error signal corresponding to a phase difference between both the signals;

a lowpass filter supplied at an input terminal with the error signal from the phase comparator and connected at an output terminal to a control voltage input terminal of the voltage controlled oscillator;

N exclusive OR circuits each connected at a first input terminal with an output terminal of the voltage controlled oscillator and at a second input terminal to the N intermediate terminals of the voltage controlled oscillator, respectively and producing N intermediate signals at respective output terminals of said N exclusive OR circuits;

an N multiplying logic circuit having N input terminals connected to the output terminals of the N exclusive OR circuits, respectively, for logically combining consecutive pairs of said intermediate signals to produce N respective output pulses for each period of said reference signal at N intermediate output terminals, wherein rising and falling edges of each of the N respective output pulses are both always triggered only by trailing edges of said intermediate signals; and an adder coupled to said intermediate output terminals ad configured to combine said N respective output pulses to produce N multiplied output signal.

22. A frequency multiplying circuit according to claim 21, wherein the N multiplying logic circuit comprises a N/2 number of flip-flop circuits connected at input terminals to input terminals of the N multiplying logic circuit.

23. A frequency multiplying circuit for multiplying a frequency of an oscillation signal by N, N being an integer greater than one, comprising:

a voltage controlled oscillator having an input terminal connected to an output terminal thereof and supplying the oscillation signal at the output terminal, said voltage controlled oscillator having N intermediate terminals for outputting signals delayed by, respectively, 1/2N, 2/2N, 3/2N, . . . N/2N times a period of the oscillation signal;

a voltage controlled delay circuit connected at an input terminal to the output terminal of the voltage controlled oscillator and having N intermediate terminals for outputting signals delayed by, respectively, N+1/2N, N+2/2N, N+3/2N, . . . 2N/2N times a period of the oscillation signal;

a frequency divider connected at an input terminal to the output terminal of the voltage controlled oscillator to produce a frequency divided signal from the oscillation signal;

a phase comparator supplied, at a first input terminal, with the frequency divided signal from the frequency divider and, at a second input terminal, with a reference signal to produce an error signal corresponding to a phase difference between both the signals;

a low pass filter supplied, at an input terminal, with the error signal and connected at an output terminal to a control voltage input terminal of the voltage controlled oscillator and to a control voltage input terminal of the voltage controlled delay circuit;

an N multiplying logic circuit having 2N input terminals, N input terminals of which are connected to the N intermediate terminals of the voltage controlled oscillator and the remaining N input terminals of which are connected to the N intermediate terminals of the voltage controlled delay circuit, respectively, for logically combining consecutive pairs of said intermediate signals to produce N respective output pulses for each period of said reference signal at N intermediate terminals, wherein rising and falling edges of each of the N respective output pulses are both always triggered only by trailing edges of said intermediate signals; and an adder coupled to said N intermediate output terminals and configured to combine said N respective output pulses produce an N multiplied output signal.

24. A frequency multiplying circuit according to claim 23, wherein the N multiplying logic circuit comprises an N number of flip-flop circuits connected at input terminals to the corresponding input terminals of the N multiplying logic circuit.

* * * * *